US006274452B1

(12) United States Patent
Miura et al.

(10) Patent No.: US 6,274,452 B1
(45) Date of Patent: *Aug. 14, 2001

(54) SEMICONDUCTOR DEVICE HAVING MULTILAYER INTERCONNECTION STRUCTURE AND METHOD FOR MANUFACTURING THE SAME

(75) Inventors: Shoji Miura; Satoshi Shiraki, both of Nukata-gun; Hajime Soga, Toyota, all of (JP)

(73) Assignee: Denso Corporation, Kariya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/965,030

(22) Filed: Nov. 5, 1997

(30) Foreign Application Priority Data

Nov. 6, 1996 (JP) .................................................. 8-293975

(51) Int. Cl.[7] .................................................. H01L 21/20
(52) U.S. Cl. .......................... 438/384; 438/382; 438/622; 438/624
(58) Field of Search ...................................... 438/597, 622, 438/624, 652, 653, 656, 384, 385, 330, 382, 618

(56) References Cited

U.S. PATENT DOCUMENTS

| 4,682,402 | * | 7/1987 | Yamaguchi | 438/384 |
|---|---|---|---|---|
| 4,975,386 | * | 12/1990 | Rao | 438/384 |
| 5,013,677 | | 5/1991 | Hozumi . | |
| 5,030,588 | | 7/1991 | Hosaka . | |
| 5,043,295 | | 8/1991 | Ruggerio et al. . | |
| 5,128,745 | | 7/1992 | Takasu et al. . | |
| 5,254,497 | * | 10/1993 | Liu | 438/384 |
| 5,310,695 | | 5/1994 | Suzuki . | |
| 5,382,916 | | 1/1995 | King et al. . | |
| 5,420,063 | * | 5/1995 | Maghsoudnia et al. | 438/384 |
| 5,471,084 | | 11/1995 | Suzuki et al. . | |
| 5,503,878 | | 4/1996 | Suzuki et al. . | |
| 5,525,831 | * | 6/1996 | Ohkawa et al. | 257/543 |
| 5,552,342 | | 9/1996 | Itou et al. . | |
| 5,879,983 | * | 3/1999 | Segawa et al. | 438/253 |

FOREIGN PATENT DOCUMENTS

| 58-90737 | 5/1983 | (JP) . |
|---|---|---|
| 63-227043 | 9/1988 | (JP) . |
| 63-252330 | 10/1988 | (JP) . |
| 2-58259 | 2/1990 | (JP) . |
| 2-303064 | 12/1990 | (JP) . |
| 3-8368 | 1/1991 | (JP) . |
| 3-104118 | 5/1991 | (JP) . |
| 4-44259 | 2/1992 | (JP) . |
| 4-44260 | 2/1992 | (JP) . |
| 5-175428 | 7/1993 | (JP) . |

* cited by examiner

Primary Examiner—Stephen D. Meier
Assistant Examiner—Jamie L. Brophy
(74) Attorney, Agent, or Firm—Pillsbury Winthrop LLP (57) ABSTRACT

After an insulating layer made of BPSG is formed on a diffusion layer, a contact hole is formed to expose the diffusion layer. Then, a first aluminum layer is formed in the contact hole. Then, first and second TEOS layers are formed. Thereafter, a thin film resistor is formed on the second TEOS layer by photo-lithography and etching treatments. In this process, the other parts are covered with the second TEOS layer to prevent being damaged. As a result, occurrence of a leak current at the diffusion layer and the like can be prevented. Further, a third TEOS layer is formed on the thin film resistor, and then a second aluminum layer is formed to be electrically connected to the thin film resistor through a contact hole by an ECR dry etching treatment. In this etching treatment, the thin film resistor is not damaged due to the third TEOS layer.

13 Claims, 11 Drawing Sheets

SEMICONDUCTOR DEVICE HAVING MULTILAYER INTERCONNECTION STRUCTURE AND METHOD FOR MANUFACTURING THE SAME

CROSS REFERENCE TO RELATED APPLICATION

This application is based upon and claims the benefit of priority of prior Japanese Patent Application No. 8-293975 filed on Nov. 6, 1996, the contents of which are incorporated herein by reference.

BACKGROUND OF THE INVENTION

1. Field of the Invention

The present invention relates to a semiconductor device having a multilayer interconnection structure with a thin film resistor and a method for manufacturing the same.

2. Related Arts

Some integrated circuits of semiconductor devices include thin film resistors formed on insulating layers as disclosed in, for example, JP-A-2-58259, JP-A-5-175428, and U.S. Pat. No. 5,382,916. Such thin film resistors are made of CrSi system material, NiCr system material or the like. Specifically, a thin film resistor made of CrSi system material (CrSi, CrSiN, or the like) has advantages such that the resistor can be easily formed in processes for manufacturing the semiconductor device, the resistor can have a resistance in a wide range including a low resistance and a high resistance, and the like. Further, a ratio of change in resistance of the CrSi system resistor can be controlled to be a positive or negative constant value or zero at a temperature within a range where the semiconductor device is generally used, by controlling a compositional ratio of the resistor or conditions of heat treatment performed on the resistor. Because of these reasons, the CrSi system resistor is noticed as a circuit element capable of being employed for various applications.

Figure 1:
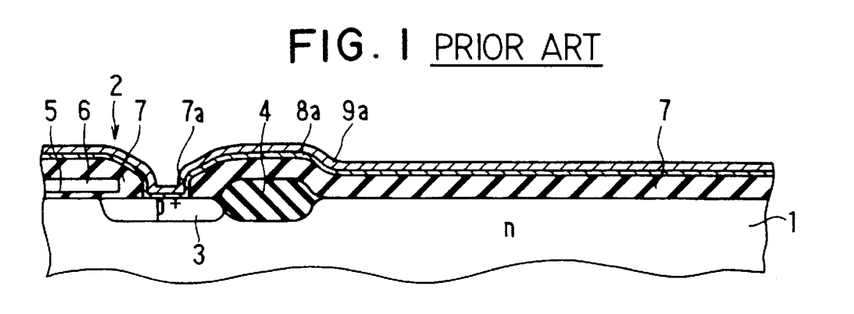
FIGS. 1 to 4 are cross-sectional views for explaining processes of forming a semiconductor device including a thin film resistor according to a prior art.

Conventional processes for forming such a thin film resistor made of CrSi that is applied to a semiconductor integrated circuit for a metal oxide semiconductor field effect transistor (MOSFET) as an example are shown in FIGS. 1 to 4. FIG. 1 shows a state where an FET region 2 is provided on a silicon substrate 1 by a transistor formation process. In this state, a source region 3 is formed in a surface portion of the FET region 2 to have a junction depth xj of, for example, approximately 0.45 μm. Further, a local oxidation of silicon (LOCOS) layer 4, a gate oxide layer 5, a gate electrode 6 made of polysilicon, and a borophosphosilicate glass (BPSG) layer 7 are formed on the silicon substrate 1. Further, a contact hole 7a is formed in the BPSG layer 7 to expose the source region 3 by a wet etching treatment. Then, a CrSi layer 8a that is intended to be a thin film resistor 8 and a TiW layer 9a that is intended to be a barrier metal layer 9 are formed on an entire surface of the substrate 1.

Figure 2:
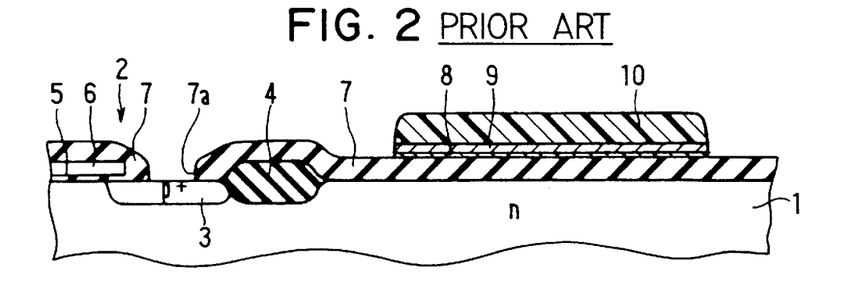

Next, as shown in FIG. 2, the TiW layer 9a and the CrSi layer 8a are individually etched by a wet etching treatment and a dry etching treatment using photo resist 10 as a mask. As a result, the thin film resistor 8 and the barrier metal layer 9 are formed on the BPSG layer 7. During the dry etching treatment for the CrSi layer 8a, the surface portion of the silicon substrate 1 exposed from the contact hole 7a is etched. The etched depth of the silicon substrate 1 is approximately 10 μm to 20 μm.

Figure 3:
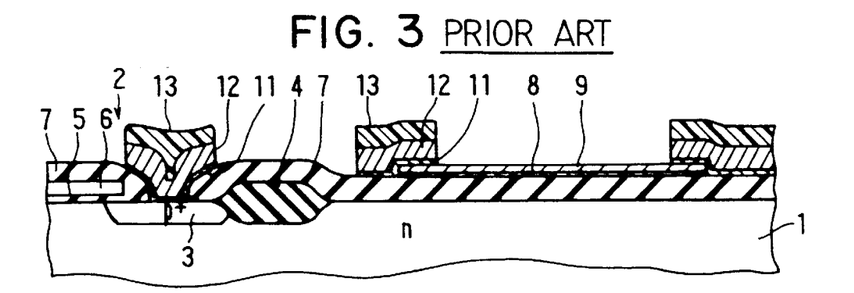

Subsequently, as shown in FIG. 3, after the photo resist 10 is removed, a TiN layer 11 that is intended to be a barrier metal layer and a AlSiCu layer 12 that is intended to be a first Al layer (a first aluminum wiring) are formed and are patterned through a photo resist layer 13 serving as a mask by a dry etching treatment. This dry etching treatment utilizes a reactive ion etching (RIE) technique. During this etching treatment, the barrier metal (TiW layer) 9 prevents the thin film resistor 8 from being etched.

Figure 4:
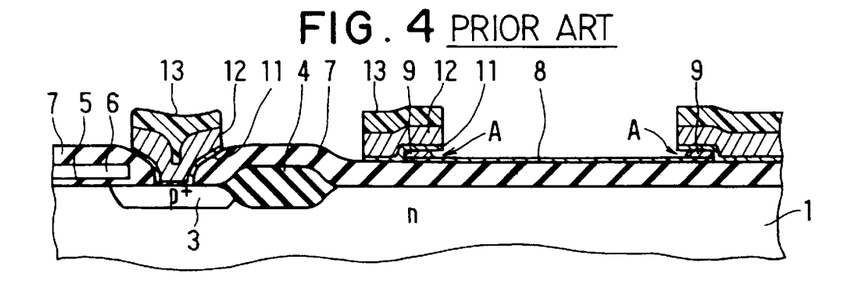

Next, as shown in FIG. 4, the TiW layer 9 except portions underlying the first Al layer 12 is removed by a wet etching treatment. Thereafter, the photo resist layer 13 is removed. Then, the processes for forming the thin film resistor 8 and the first Al layer are completed. The TiW layer 9 left between the first Al layer 12 and the thin film resistor 8 can prevent diffusion between the thin film resistor 8 and the first Al layer 12 to prevent deterioration of resistance characteristics of the thin film resistor 8. However, when the TiW layer 9 is etched, over-etching is usually performed to prevent the TiW layer 9 from remaining. This over-etching is likely to cause under-cut of the TiW layer 9 underlying the first Al layer 12 as indicated by arrows A in FIG. 4.

SUMMARY OF THE INVENTION

In addition to the above-mentioned problems, requirements for miniaturization and high density integration of an element in recent years accompany a shallow junction (pn junction) of a diffusion layer and fine processing of Al wiring. The fine processing of Al wiring further requires plasma having a high density in a dry etching treatment. To obtain a high integrated density suitable for producing the microcomputer, a wiring width and an opening width of a wiring pattern are limited to be respectively and approximately 1 μm. The pn junction depth xj is also limited to be approximately 0.15 μm.

To comply with these requirements, the inventors of the present invention have studied a method for forming a thin film resistor on a semiconductor integrated circuit device based on the above-mentioned design rule (0.8 μm rule). The studied processes will be explained referring to FIGS. 5 to 8. In this experiment, a source region 15 was formed in a surface region of the substrate 1 to form a pn junction having a depth xj of approximately 0.15 μm in place of the source region 3 in FIGS. 1 to 4 and a scale in a horizontal direction in FIGS. 5 to 8 is set to be approximately one fifth of that in FIGS. 1 to 4. The other constitutions in FIGS. 5 to 8 are substantially the same as those shown in FIGS. 1 to 4. Explanations similar to those described above referring to FIGS. 1 to 4 will be omitted.

Figure 5:
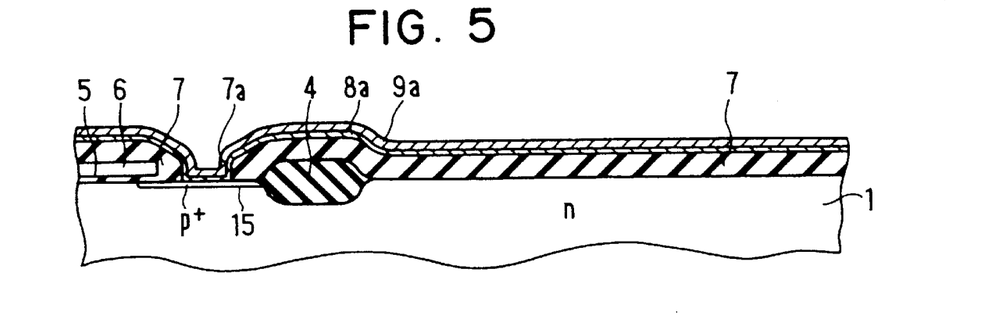
FIGS. 5 to 8 are cross-sectional views for explaining experimental processes of forming a semiconductor device including a thin film resistor, performed for clarifying problems of the processes.

FIG. 5 corresponding to FIG. 1 shows a state where the CrSi layer 8a serving as the thin film resistor 8 and the TiW layer 9a serving as the barrier metal 9 were formed on the BPSG layer 7. In this case, after the contact hole 7a was formed in the BPSG layer 7, a reflow treatment was performed at a temperature of approximately 900° C.–950° C.

Figure 6:
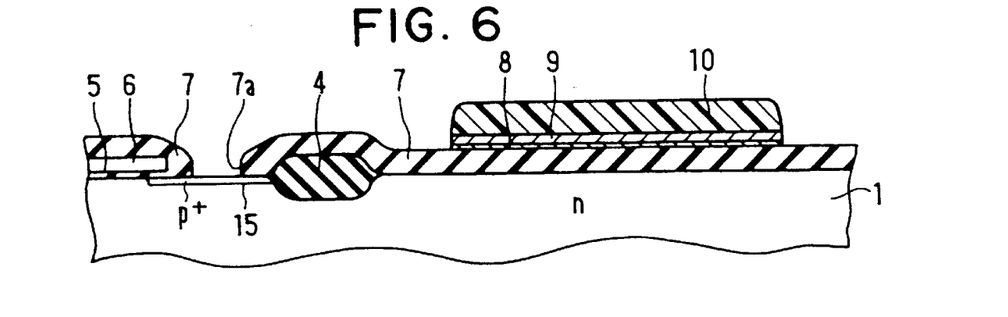

Next, as shown in FIG. 6, the TiW layer 9a and the CrSi layer 8a were etched by a dry etching treatment through the photo resist 10. At that time, the surface of the silicon substrate 1 exposed from the contact hole 7a was simultaneously etched so that the etched depth was approximately 10 nm to 20 nm. As a result, the pn junction depth xj of the source region being approximately 0.15 μm was reduced by the etched depth.

Figure 7:
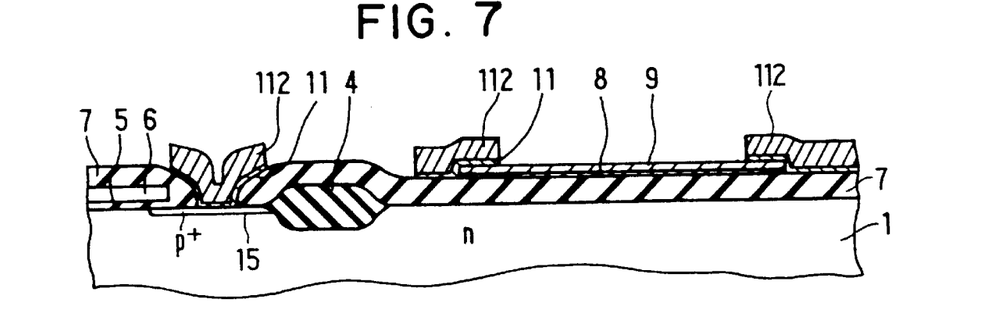

Next, after the barrier metal layer 11 was formed, Al/TiN/Ti layers for serving as a first Al layer 112 were deposited by a sputtering method, and were patterned by an electron cyclotron resonance (ECR) dry etching treatment using photo resist as a mask, resulting in a state shown in FIG. 7. The reason why the ECR dry etching treatment was employed is because the ECR dry etching treatment can provide plasma having a high density by a low etching pressure, which can provide fine processing complying with the 0.8 μm rule. However, by performing the ECR dry etching treatment, not only the first Al layer 112 but also the exposed portion of the barrier metal 9 on the thin film resistor 8 was etched. Therefore, there occur some cases that the barrier metal 9 is removed to expose the thin film resistor 8 made of CrSi so that the thin film resistor 8 is also etched.

Figure 8:
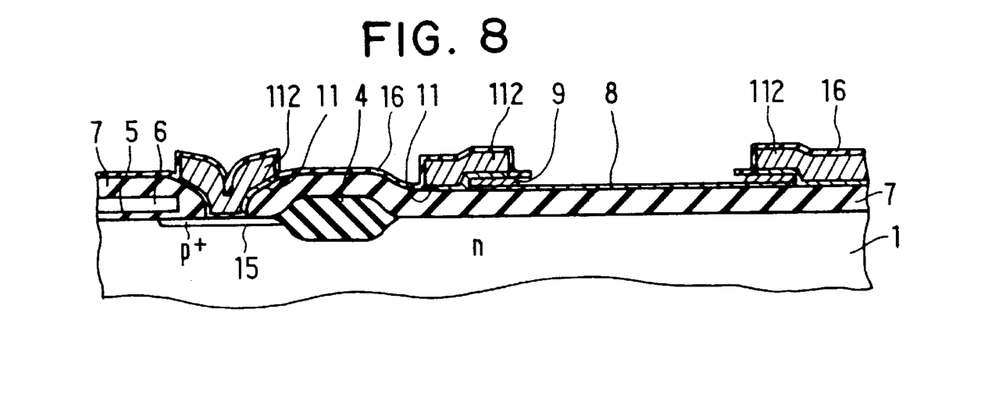

Next, as shown in FIG. 8, after a plasma silicon nitride (P-SiN) layer 16 was formed, a part of the P-SiN layer 16 formed on the thin film resistor 8 was removed by the etching treatment utilizing a photo-lithography technique. Successively, the TiW layer 9 serving as the barrier metal was removed by a wet etching treatment, so that the process for forming the thin film resistor were completed.

As the result of the above-mentioned experiment, the following problems were found out. That is, when the CrSi layer 8a is etched by the dry etching treatment in the state where the surface of the silicon substrate 1 is exposed from the contact hole 7a, the surface of the silicon substrate 1 is etched by 10 nm to 20 nm, resulting in decrease of the pn junction depth. Especially in the case that the 0.8 μm rule is adopted, the decrease of the pn junction depth causes deficiencies such as a leakage current that is not negligible.

To prevent the etching of the surface of the substrate 1, the etching of the thin film resistor 8 may be performed before the contact hole 7a is formed. In this case, however, because the formation process of the contact hole 7a includes heat treatments at such as a second reflow treatment and a baking treatment that are performed at temperatures higher than 500° C., there arises a problem that the CrSi layer 8 is deteriorated during the heat treatments. Accordingly, it becomes difficult to obtain a required resistance of the thin film resistor 8.

Further, when the ECR dry etching treatment is performed on the first Al layer 112, the TiW layer 9 is simultaneously etched. In this etching treatment, there are some cases that the TiW layer 9 is etched to expose the CrSi layer 8 so that the CrSi layer 8 is also etched. As a result, it is apparent that the thin film resistor 8 having a required resistance cannot be obtained.

The present invention has been made in view of the above-mentioned problems and an object of the present invention is to provide a thin film resistor formed on a semiconductor device to which a design rule sufficient for producing a microcomputer is applied and a method for manufacturing the same. More specifically, an object of the present invention is to provide a semiconductor device including a thin film resistor and a method for manufacturing the same without causing a leakage current at a pn junction of the device by a formation process for the thin film resistor. Another object of the present invention is to provide a structure of a semiconductor device to which a design rule sufficient for producing a microcomputer is applied, in which aluminum wiring is formed on a thin film resistor without having an undercut portion etched by an etching process, and a method for manufacturing the same.

Briefly, in a semiconductor device according to the present invention, a thin film resistor is interposed between first and second insulating layers. Therefore, the thin film resistor can be formed without adversely affected by the other processes, resulting in stable characteristics of the thin film resistor. Further, the process of forming the thin film resistor does not adversely affect the other layers. Preferably, the first and second insulating layers are made of tetraethoxysilane (TEOS). Preferably, the thin film resistor is made of CrSi system material. In this case, it is easy to control a rate of change in resistance of the thin film resistor to be a constant value in an usually operated temperature range, and stable characteristics of the thin film resistor can be obtained with high repeatability.

The semiconductor device further has first and second wiring patterns sandwiching the first insulating layer, the thin film resistor, and the second insulating layer. When a through hole is formed in the second insulating layer, the thin film resistor can be electrically connected to the second wiring pattern through the through hole. An aluminum system electrode may be formed in the through hole to be interposed between the thin film resistor and the second wiring pattern. A barrier metal may be interposed between the thin film resistor and the aluminum system electrode to prevent diffusion between the thin film resistor and the aluminum system electrode. In this structure, the second wiring pattern can be formed without exposing the thin film resistor.

Further, according to the present invention, in a case where the semiconductor device has a diffusion layer formed in a surface region of a substrate, an insulating layer is formed on the diffusion layer and a contact hole is formed in the insulating layer. Then, after the contact hole is filled with an electrode material, the thin film resistor is formed. Therefore, the diffusion layer is not damaged during the formation process of the thin film resistor.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENT

An embodiment according to the present invention that is applied to an integrated circuit including a MOSFET will be described hereinunder with reference to FIGS. 9 through 22. The MOSFET adopts a design rule suitable for producing a microcomputer (for example, 0.8 μm design rule). The integrated circuit having the MOSFET is hereinafter referred to as a MOSIC.

Figure 9:
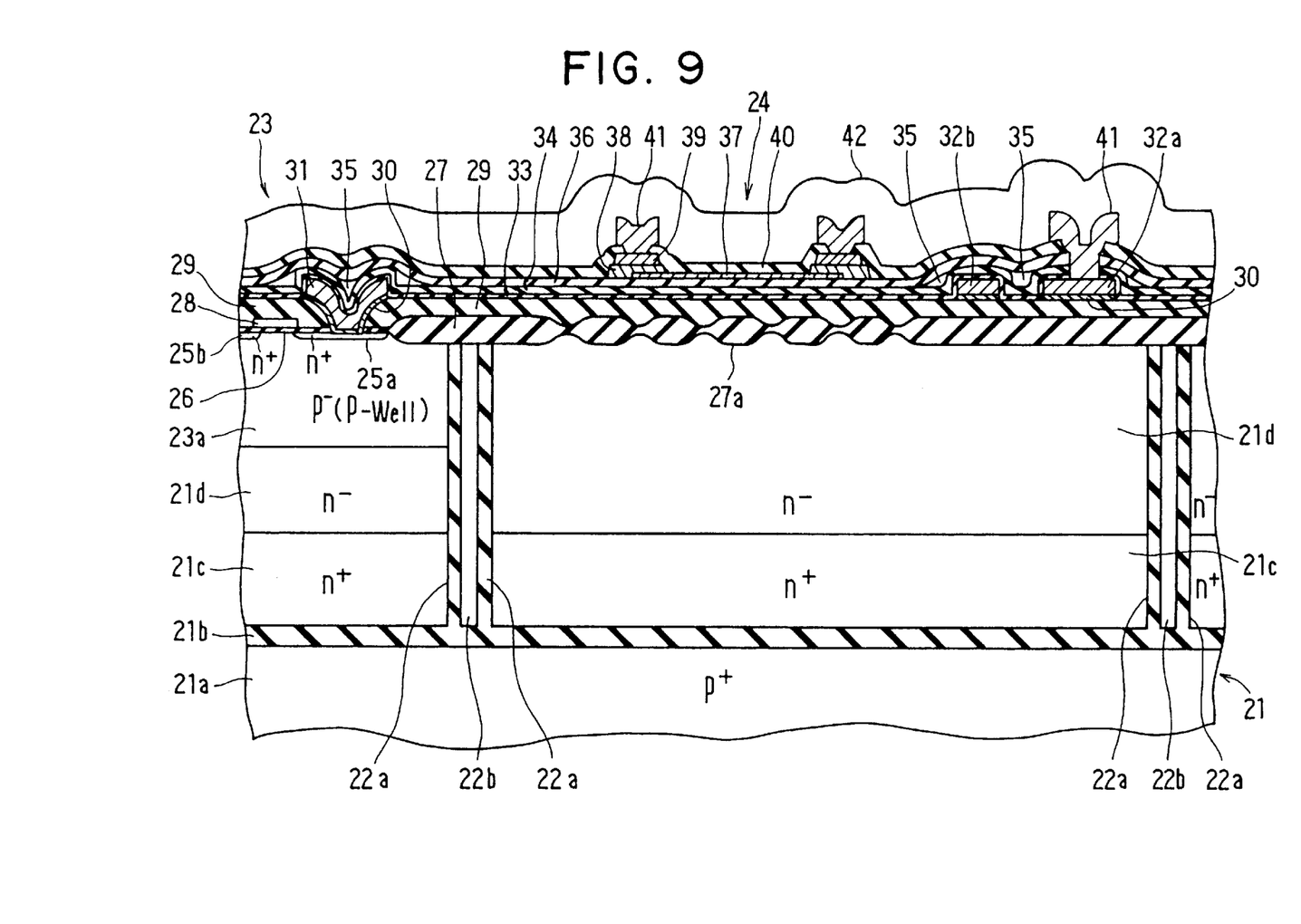
FIG. 9 is a cross-sectional view showing a semiconductor device including a thin film resistor in a preferred embodiment according to the present invention.

FIG. 9 schematically shows a cross-sectional view of the MOSIC manufactured by a method according to the present invention to have a high integrated density. A silicon substrate 21 of the MOSIC has a silicon-on-insulator (SOI) structure in which an n-type layer 22c having a high impurity concentration and an n-type layer 21d having a low impurity concentration are provided on a p-type substrate layer 21a via a silicon oxide (SiO$_2$) layer 21b. The upper portion of the silicon substrate 21 in FIG. 1 with respect to the silicon oxide layer 21b is an element formation region. A trench isolation process is performed on the element formation region so that trenches are formed in the element formation region and a silicon oxide layer 22a and a polycrystal silicon layer 22b are formed in the trenches. By performing the trench isolation process, the element formation region is divided into an FET formation region 23 and a thin resistor formation region 24.

The FET formation region 23 has a p-type well layer 23a formed by doping p-type impurities into the n-type layer 21d having the low impurity concentration. Further, an n-type source region 25a and an n-type drain region 25b, both of which have high impurity concentrations, are formed in the surface portion of the p-type well layer 23a. A pn junction depth xj at the source region 25a and at the drain region 25b is controlled to be approximately 0.15 µm on the basis of the above-mentioned design rule.

A gate oxide layer 26 having a specific thickness is formed on the surface of the FET formation region 23 across the source region 25a and the drain region 25a. Further, a LOCOS layer 27 that serves as a field oxide layer is formed on the element formation region on an area other than the area where the gate oxide layer 26 is formed. The LOCOS layer 27 includes an irregularity region 27a having a check pattern on the surface of the substrate 21 and irregularity in a depth direction of the substrate 21. The irregularity region 27a of the LOCOS layer 27 is provided to disperse a laser beam during a trimming process described later.

A gate electrode 28 made of polysilicon is formed on the gate oxide layer 26 in the FET formation region 23, and a BPSG layer 29 is formed on the gate electrode 28 by a CVD method or the like. Then, contact holes are formed to expose the source region 25a and the drain region 25b, and a titanium nitride (TiN) layer 30 and an AlSiCu layer 31 serving as a first aluminum (Al) layer are formed in the contact holes to function as a source electrode and a drain electrode. The wiring pattern of the first Al layer 31 are disposed not only in the contact holes but also on the BPSG layer 29 to form wiring patterns 32a and 32b.

Further, a plasma silicon nitride layer (P-SiN) 33 is formed to cover the wiring patterns 31, 32a, and 32b. Then, a first tetraethoxysilane (TEOS) layer 34 that is an insulating layer is further formed on the P-SiN layer 33. The surface of the first TEOS layer 34 is flattened by spin-on-glass (SOG) portions 35, and then a second TEOS layer 36 is formed on the first TEOS layer 34. Further, a thin film resistor 37 is formed on a specific portion of the second TEOS layer 36. The thin film resistor 37 is a CrSi layer formed by a sputtering method to have a thickness of approximately 15 nm. An AlSi layer 39 that serves as electrodes for the thin film resistor 37 is formed on both end portions of the thin film resistor 37 via a TiW layer 38 that serves as a barrier metal.

In addition, a third TEOS layer 40 that is an upper insulating layer is formed. Then, contact holes Via are formed at the specific portions to expose the AlSi layer 39 and the AlSiCu layer 32a, and an AlSi layer 41 that is a second Al layer is formed in the contact holes Via to make contact with the AlSi layer 39 and the AlSiCu layer 32a. Then, a passivation layer made of a P-SiN layer 42 is formed as an uppermost layer for protecting the entire surface of the element.

Then, the trimming process using a laser beam is performed on the thus formed chip to adjust a value of resistance of the CrSi layer 37 that serves as the resistor. At that time, because the irregularity region 27a of the LOCOS layer 27 having fine irregularity in the depth direction of the substrate 21 underlies the thin film resistor 37 and disperses the laser beam, adverse effects with respect to the trimming process caused by interference of the beam and the like can be prevented.

Figure 10:
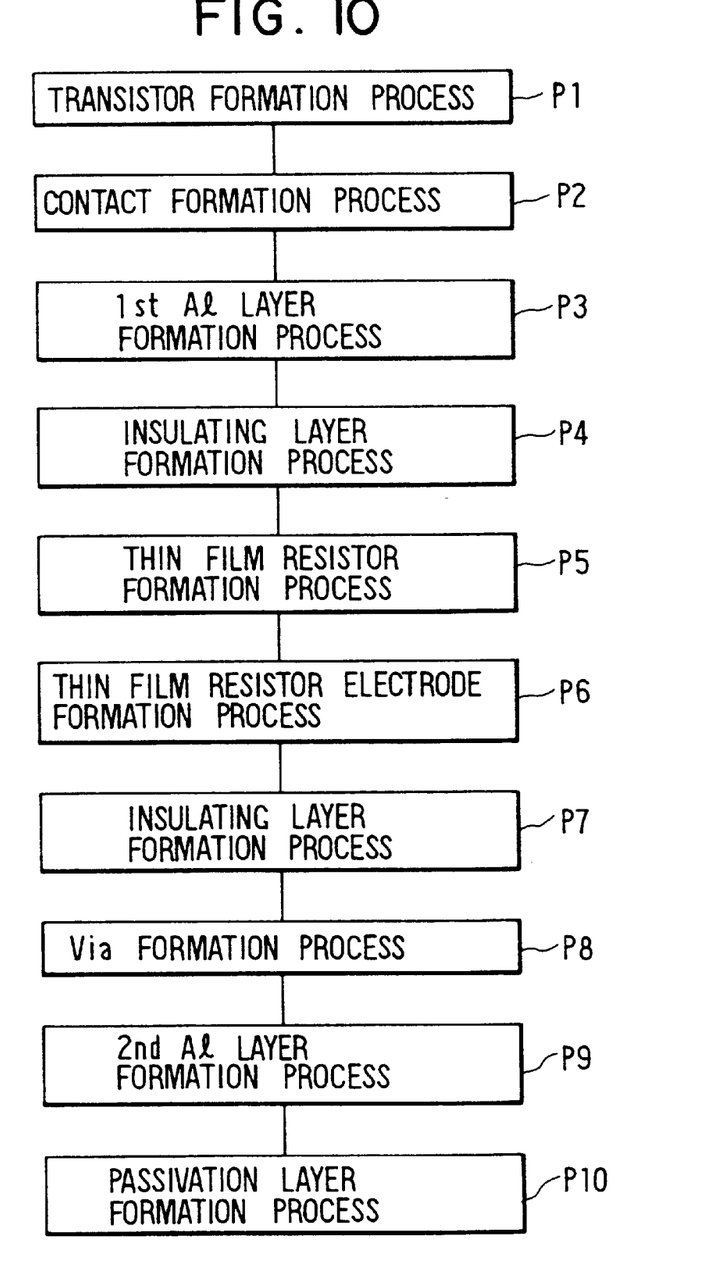
FIG. 10 is a flow chart showing processes of manufacturing the semiconductor device in the embodiment according to the present invention.

Next, a method for manufacturing the above-mentioned MOSIC will be explained in more detail referring to FIGS. 10 to 22. The method includes ten processes P1 to P10 as shown in FIG. 10. Each of the processes will be explained in that order.

[Process P1: Transistor Formation Process]

Figure 11:
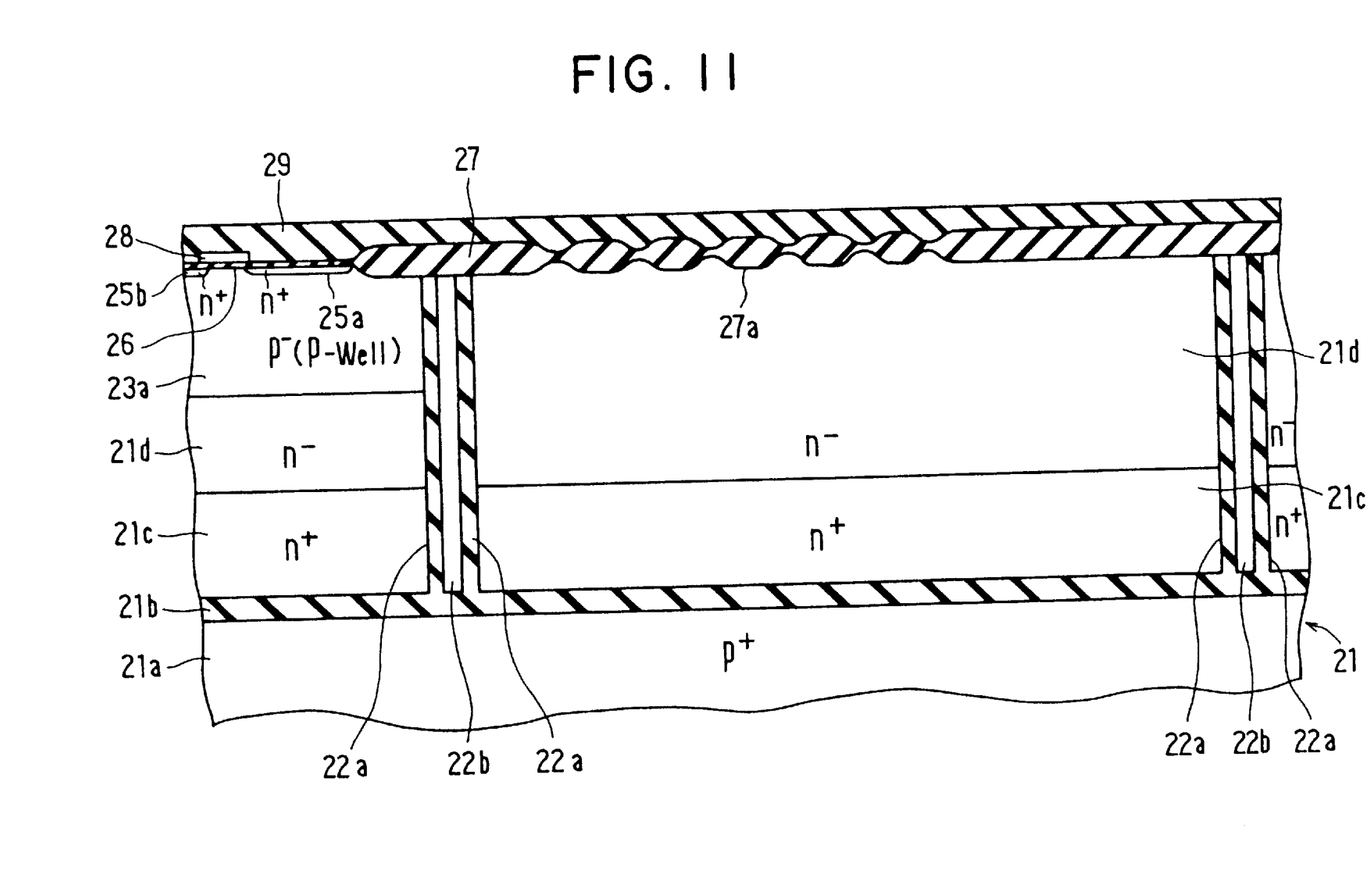
FIGS. 11 through 22 are cross-sectional views for respectively explaining the processes indicated in FIG. 10 in the embodiment according to the present invention.

As shown in FIG. 11, the silicon substrate 21 having the SOI structure is previously formed such that the n-type layer 21c having a high impurity concentration and the n-type layer 21d having a low impurity concentration are formed on the p-type substrate layer 21a having a high impurity concentration via the silicon oxide layer 21b. Then, an isolation process is performed on this silicon substrate 21 so that the silicon substrate 21 is divided into the FET formation regions 23 and the thin film resistor formation regions 24 on which various elements such as the MOSFET and the thin film resistor are respectively to be formed.

In the isolation process, deep trenches (grooves) are formed on boundary portions between the FET formation regions 23 and the thin film resistor formation regions 24 to reach the silicon oxide layer 21b by an etching treatment or the like. Thereafter, the silicon oxide layer 22a is formed on side walls of the trenches to isolate the FET formation regions 23 and the thin film resistor formation regions 24. Then, spaces surrounded by the silicon oxide layer 22a in the trenches are filled with the polycrystal silicon layer 22b so that the surface of the silicon substrate 21 is flattened.

Next, a pattern is formed on the surface of the silicon substrate 21 by the photo-lithography treatment, and then, p-type impurities such as boron (B) are doped into the FET formation regions 23 by an ion implantation method or the like. Thereafter, a heat treatment is performed on the silicon substrate 21. As a result, the p-type well layer (p-well) 23a in which the p-type impurities are diffused is formed. A silicon nitride (Si$_3$N$_4$) layer is formed by a CVD method or the like, and is patterned to have windows opening on the trench regions between the FET formation regions 23 and the thin film resistor formation regions 24 for forming the LOCOS layer 27 that serves as the field oxide layer. Then the LOCOS layer 27 is formed to have the irregularity regions 27a with a check pattern. The irregularity regions 27a of the LOCOS layer 27 serves to improve workability of the thin film resistor 37 when performing the laser trimming process.

Next, the gate oxide layer 26 is formed on the p-type well layer 23a of the FET formation regions 23 to have a specific thickness. Then, a polysilicon layer is deposited on the gate oxide layer 26 by the CVD method and is patterned to form the gate electrode 28. Thereafter, n-type impurities such as arsenic (As) are doped into the p-type well layer 23a through the gate electrode 28 and then a heat treatment is performed. As a result, the source region 25a and the drain region 25b are formed in the surface portion of the p-type well layer 23a. In this way, an n-channel MOSFET is formed. To form a p-channel MOSFET at a p-channel MOSFET formation region that is not shown, p-type impurities such as B are doped into a well layer to form a source region and a drain region in place of the n-type impurities. Thereafter, the BPSG layer 29 that is one of the insulating layers is formed on the entire surface of the silicon substrate 21 by the CVD method or the like to have a specific thickness, and then a reflow treatment is performed.

[Process P2: Contact Formation Process]

Figure 12:
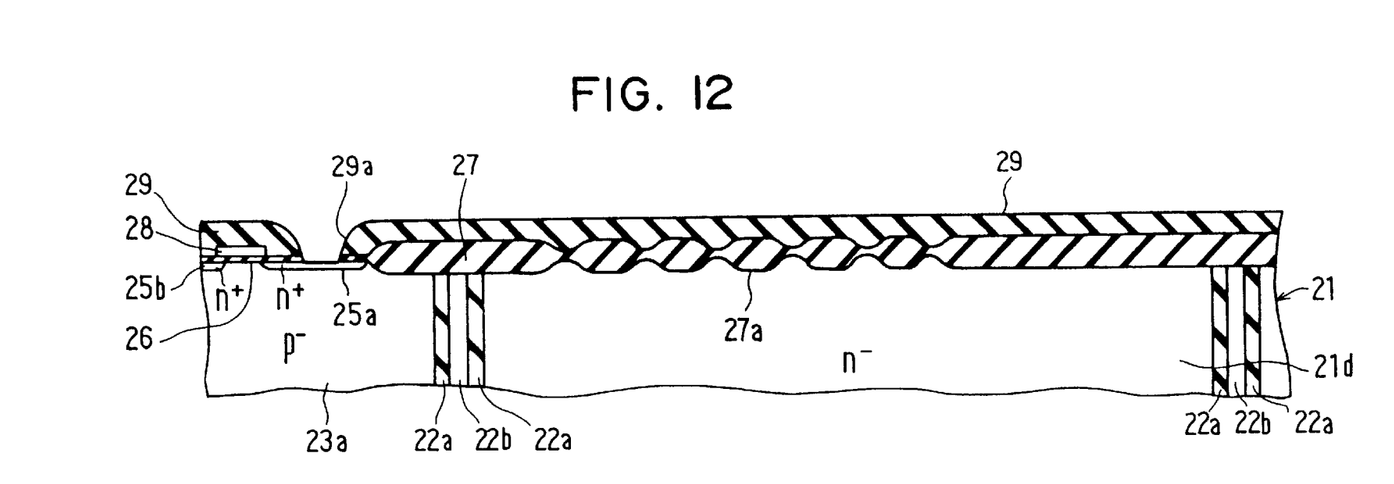

As shown in FIG. 12, a pattern having windows opening at portions where the contact holes 29a are to be formed in the BPSG layer 29 is disposed on the BPSG layer 29 by using the photo-lithography technique, and the BPSG layer 29 and the gate oxide layer 26 are etched through the pattern by a dry etching treatment. As a result, the contact holes 29a are formed. Thereafter, a reflow treatment is performed at a temperature of approximately 900° C.–950° C. so that the edge portions of the contact holes 29a are rounded. At that time, the surfaces of the source region 25a and the drain region 25b that are exposed from the contact holes 29a are slightly etched, so that the junction depth xj is slightly reduced by the etched depth.

[Process P3: First Al Layer Formation Process]

Figure 13:
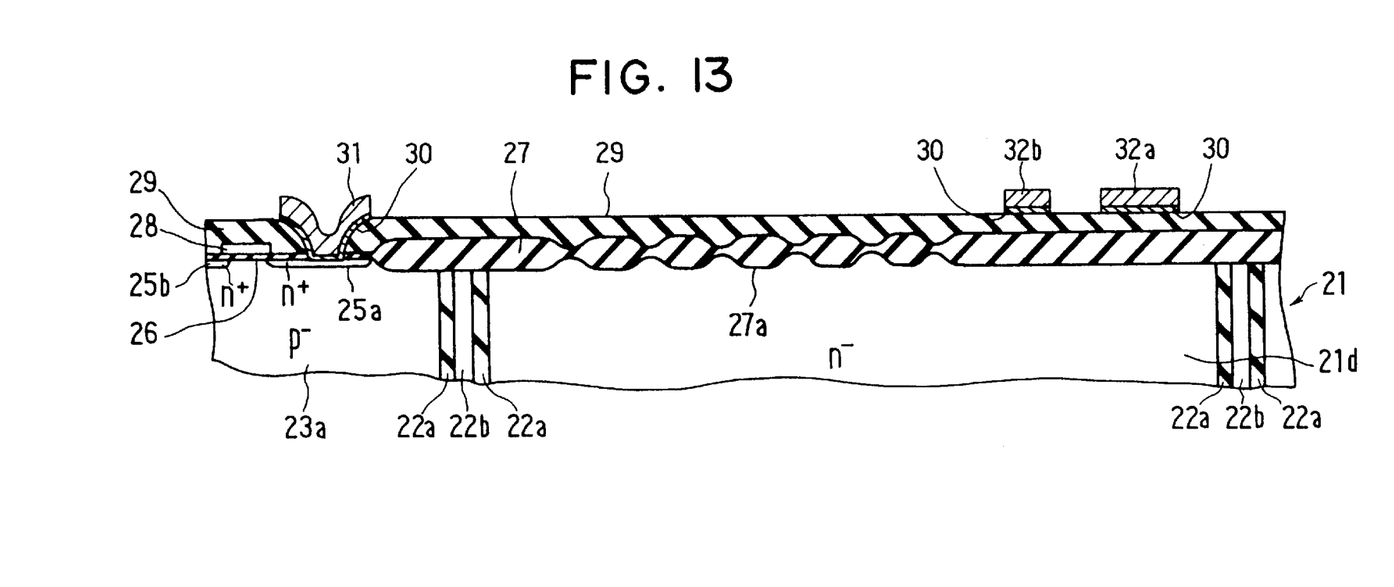

Next, as shown in FIG. 13, the first Al layer 31 for forming the lower wiring pattern is formed. In this case, prior to the formation of the first Al layer 31, the TiN layer 30 that serves as the barrier metal is formed on the BPSG layer 29 as well as on the contact holes 29a to have a thickness of approximately 100 nm. Successively, an AlSiCu layer for the first Al layer 31 is formed on the TiN layer 30 to have a thickness of approximately 0.45 $\mu$m by a sputtering method. Then, a resist pattern is formed on the AlSiCu layer by using the photo-lithography technique to have a shape corresponding to the pattern of the first Al layer 31, and the AlSiCu layer and the TiN layer 30 is etched through the resist pattern by a dry etching treatment. As a result, the first Al layer 31 is obtained. In this embodiment, an ECR (electron cyclotron resonance) dry etching technique is employed for the dry etching treatment. When the ECR dry etching treatment is performed, because the surface of the silicon substrate 21 other than the area where the first Al layer 31 is to remain is covered with the BPSG layer 29, the surface of the silicon substrate 21 is not damaged.

[Process P4: Insulating Layer Formation Process (The First Half)]

Figure 14:
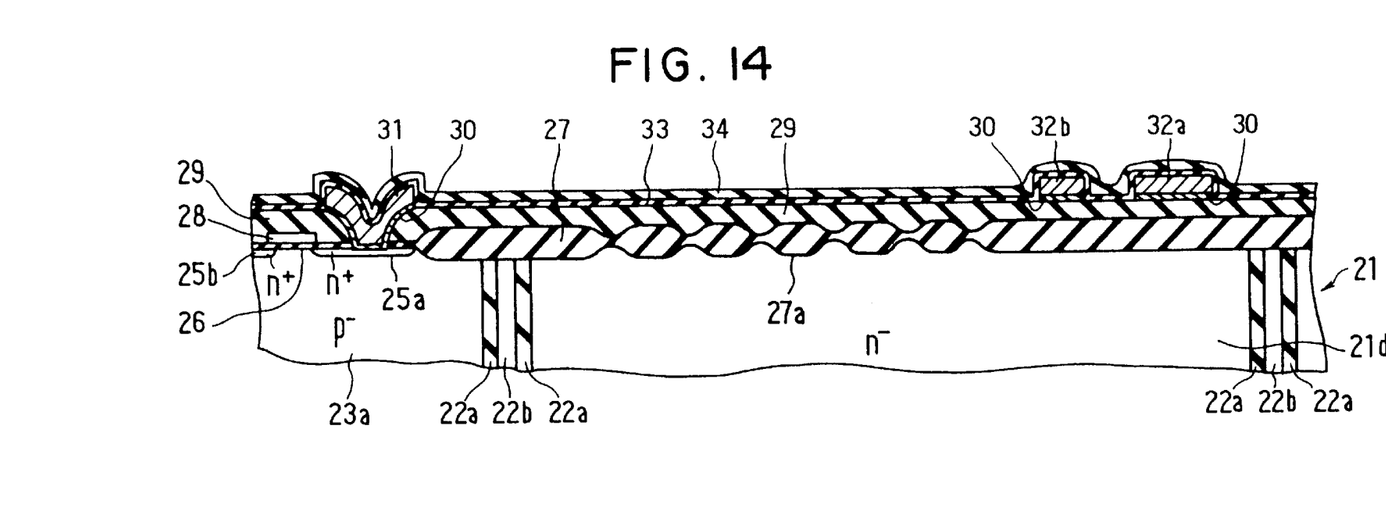
Figure 15:
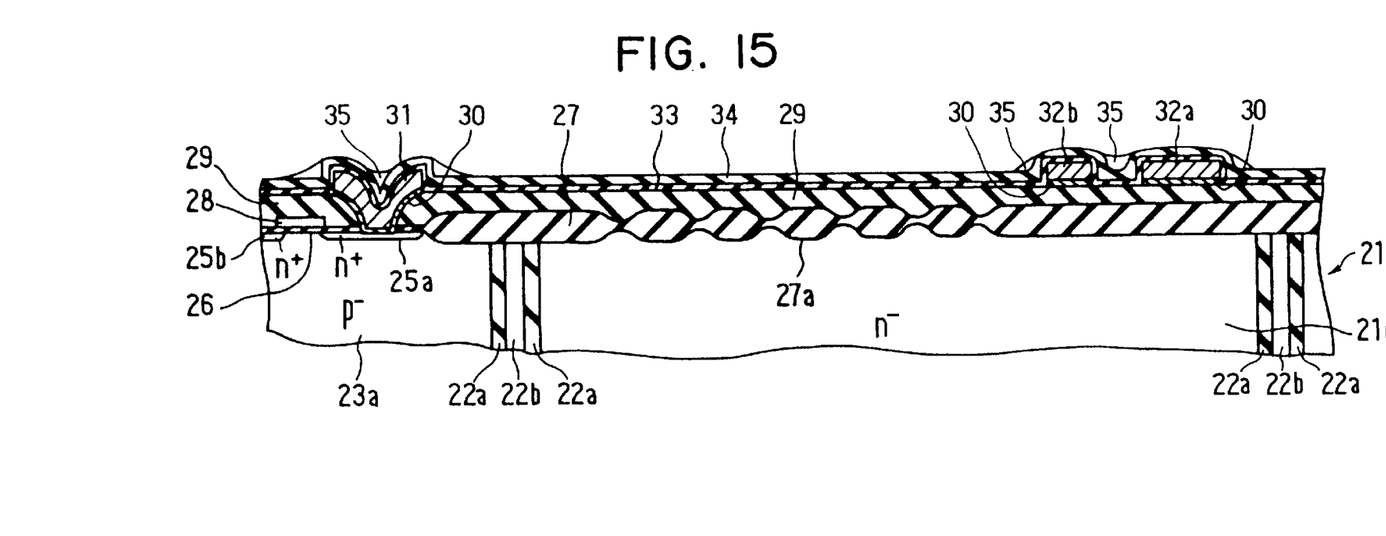
Figure 16:
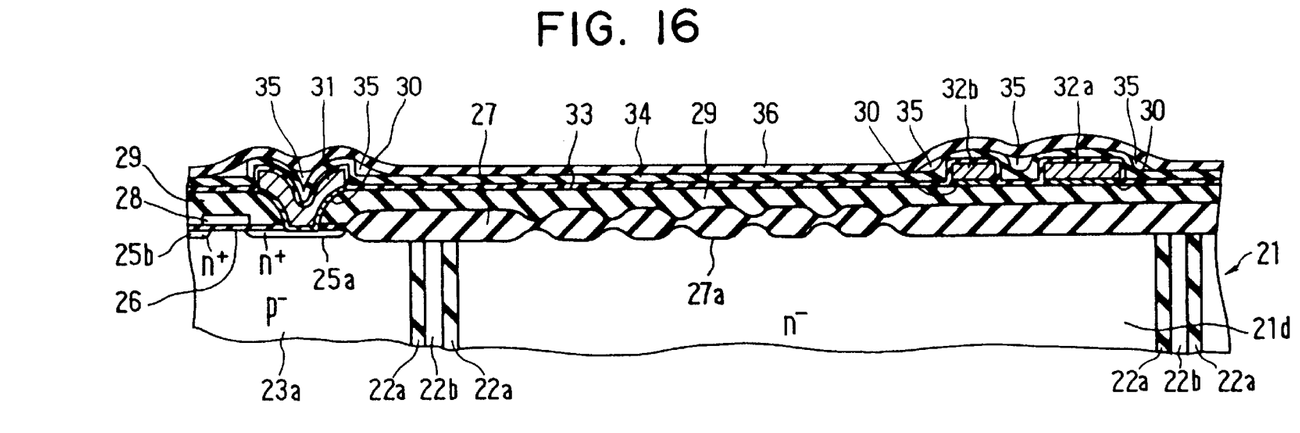

Next, the lower insulating layers are formed in the following way. Firstly, as shown in FIG. 14, the P-SiN layer 33 is deposited on the BPSG layer 29 as well as on the first Al layer 31 at a treatment temperature of, for example, 380° C. Thereafter, the first TEOS layer 34 is deposited on the P-SiN layer 33 by the CVD method to have a thickness of approximately 0.2 $\mu$m. In this case, the treatment temperature is, for example, 420° C. Next, an SOG layer is coated on the first TEOS layer, and then baking and etch back treatments are performed so that the uneven portions of the surface of the silicon substrate 21 are flattened by the SOG portions 35 as shown in FIG. 15. Then, as shown in FIG. 16, the second TEOS layer 36 is deposited on the first TEOS layer 34 as well as on the SOG portions 35 by the CVD method at a treatment temperature of, for example, 420° C. to have a thickness of approximately 0.3 $\mu$m. In this case, the thickness of the second TEOS layer 36 is set such that the sum of the thicknesses of the second TEOS layer 36 and the third TEOS layer 40 that is formed in the subsequent process becomes to be approximately 0.5 $\mu$m, i.e., equal to the thickness of the second TEOS layer formed by the conventional processes.

[Process P5: Thin Film Resistor Formation Process]

Figure 17:
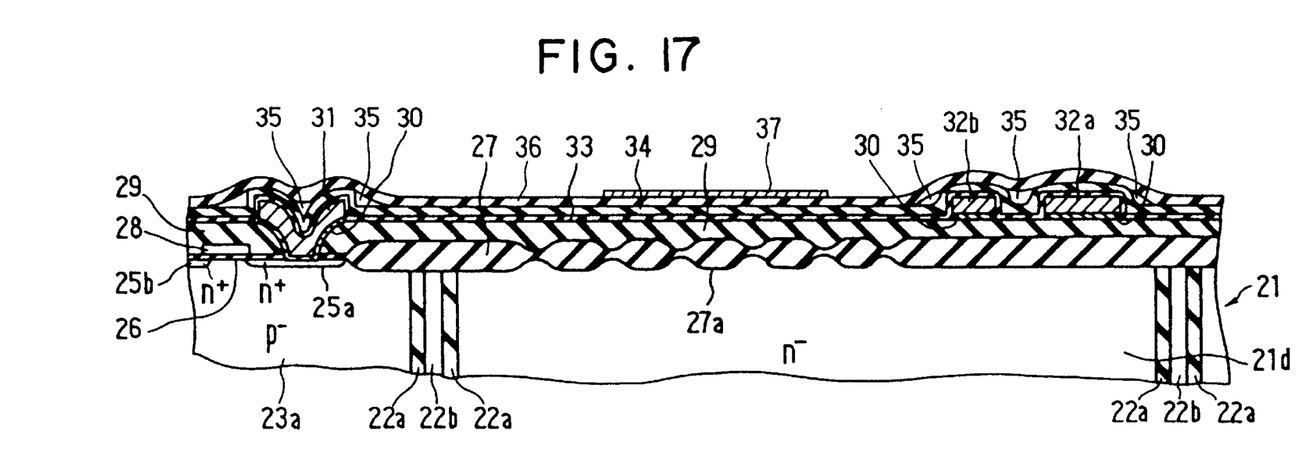

Next, the CrSi layer for the thin film resistor 37 is deposited on the second TEOS layer 36 by the sputtering method to have a thickness of approximately 15 nm. Then, photo-resist is disposed on the CrSi layer and is patterned to have a shape corresponding to the thin film resistor 37 by using the photolithography technique. Then, unnecessary portions of the CrSi layer is removed by the dry etching process. As a result, as shown in FIG. 17, the thin film resistor 37 is formed on the second TEOS layer 36. By performing this dry etching process, the silicon substrate 21 is not exposed, and instead, the second TEOS layer 36 is exposed. That is, the silicon substrate 21 is not damaged by the dry etching process.

[Process P6: Thin Film Resistor Electrode Formation Process]

Figure 18:
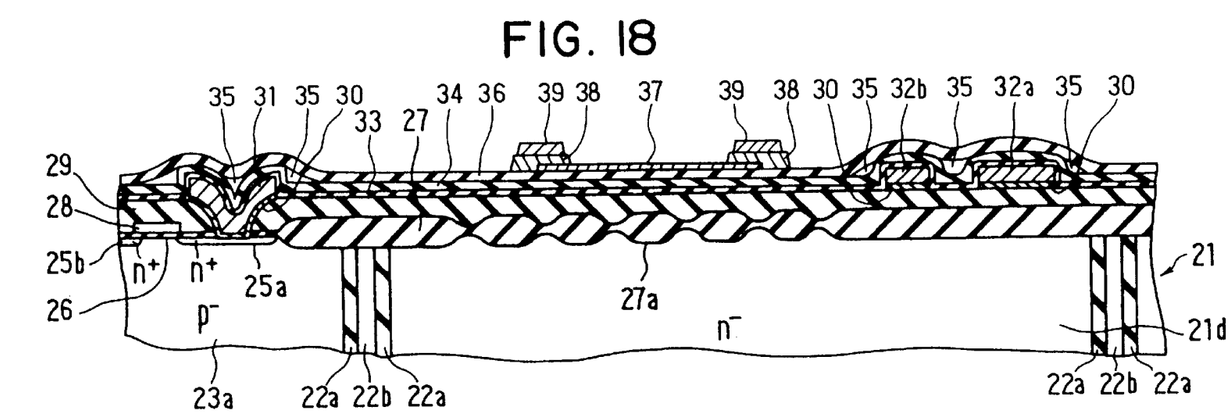

Next, the TiW layer 38 for serving as the barrier metal is deposited on the thin film resistor 37 by the sputtering method to have a thickness of approximately 0.1 $\mu$m. Successively, the AlSi layer 39 for serving as the electrode for the thin film resistor 37 is deposited on the TiW layer 38 by the sputtering method to have a thickness of approximately 0.2 $\mu$m. Then, photo resist is disposed on the AlSi layer 39 and is patterned by the photo-lithography treatment in order to form the electrodes on both end portions of the thin film resistor 37. The AlSi layer 39 is etched through the photo resist by a wet etching treatment. In this case, a mixture of phosphoric acid and nitric acid is used as an etching solution. This etching solution does not resolve the TiW layer 38 underlying the AlSi layer 39 even if over-etching is performed. After the etching treatment of the AlSi layer 39 is performed, Si-nodule etching treatment is performed. Then, another wet etching treatment is performed on the TiW layer 38. As a result, the electrodes 39 shown in FIG. 18 are formed on the thin film resistor 37 via the barrier metal layer 38. In this etching treatment, the CrSi layer 37 underlying the TiW layer 38 is not etched, so that the patterning process for the electrodes can be securely performed. Here, the same photo resist pattern is used in both etching processes for the AlSi layer 39 and for the TiW layer 38. Because of this, the AlSi layer 39 is slightly etched during the etching process of the TiW layer 38, so that the peripheral portion of the AlSi layer 39 is slightly etched in comparison with the peripheral portion of the TiW layer 38 to be in an undercut state.

[Process P7: Insulating Layer Formation Process (The Second Half)]

Figure 19:
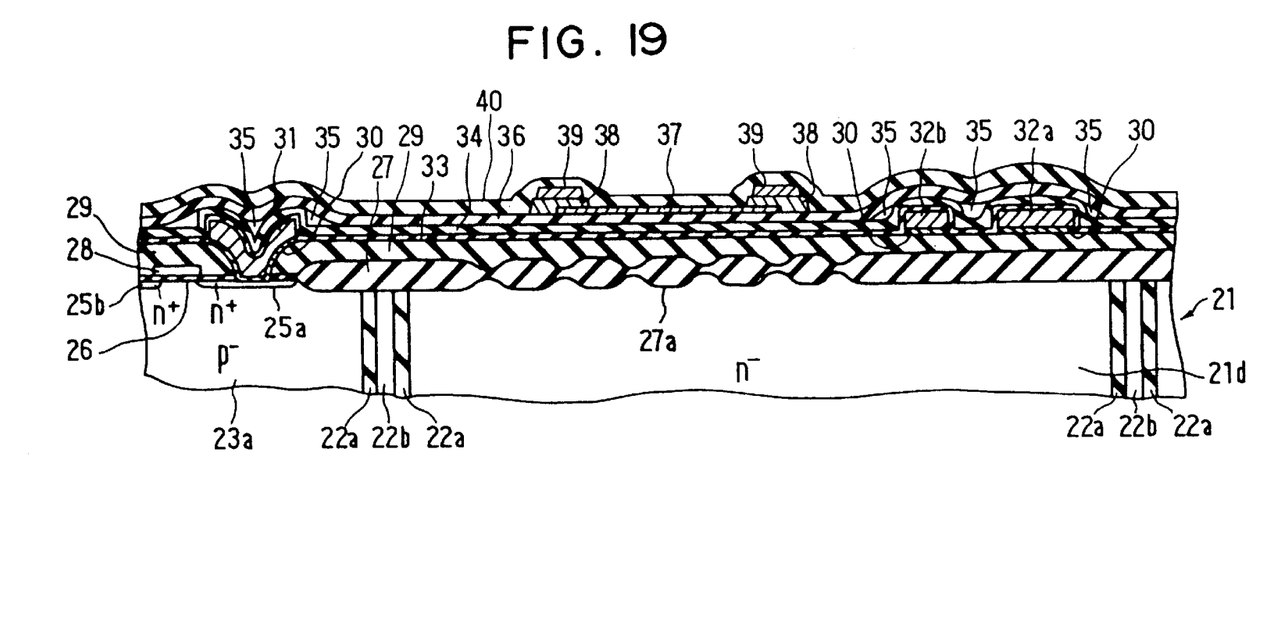

Next, as shown in FIG. 19, the third TEOS layer 40 that is the an upper insulating layer is deposited on the second TEOS layer 36 by the CVD method at a treatment temperature of, for example, 420° C. to have a thickness of approximately 0.3 $\mu$m. Accordingly, the thin film resistor 37 is sandwiched between the second TEOS layer 36 and the third TEOS layer 40.

[Process P8: Via Formation Process]

Figure 20:
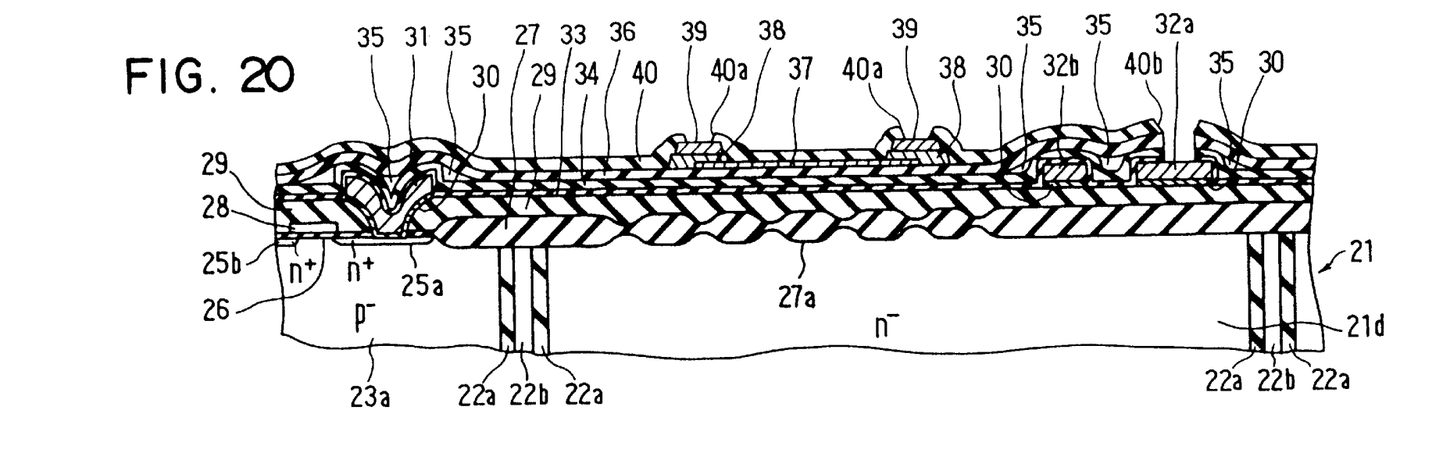

As shown in FIG. 20, the contact holes (Via) 40a and 40b are formed by using the photo-lithography technique for securing an electrical contact with the second Al layer 41 that is subsequently formed to form an upper wiring pattern. The contact holes (via) include Via 40a exposing the electrodes (AlSi layer) 39 electrically connected to the thin film resistor 37 and the Via 40b exposing the first Al layer 32a.

[Process P9: Second Al Layer Formation Process]

Figure 21:
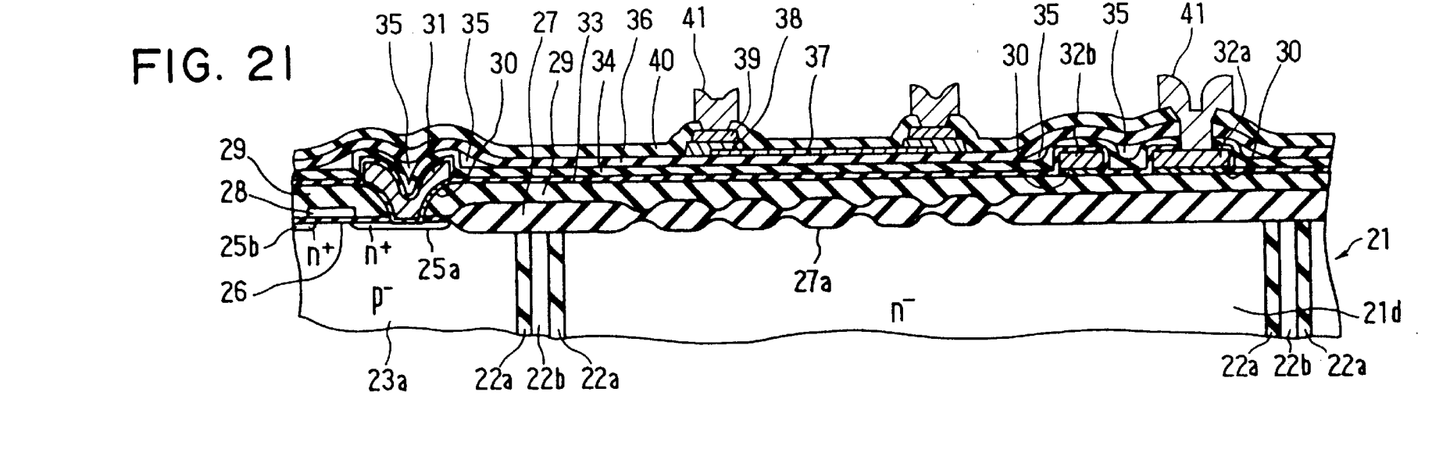

Subsequently, the second Al layer 41 made of AlSiCu is deposited on the third TEOS layer 40 as well as in the Via 40a and 40b by the sputtering method to have a thickness of approximately 0.9 μm. Then, photo resist is disposed on the second Al layer 41 and is patterned by using the photolithography technique to remain only on the electrode formation areas. Then, the ECR dry etching treatment is performed on the second Al layer 41 to remove unnecessary portions of the second Al layer 41. By performing this etching treatment, the third TEOS layer 40 is exposed. Therefore, the thin film resistor 37 and the electrodes 39 are not adversely affected by the etching treatment. After the wiring pattern of the second Al layer 41 is formed, a sintering treatment at, for example, 450° C. is executed.

[Process P10: Passivation Layer Formation Process]

Figure 22:
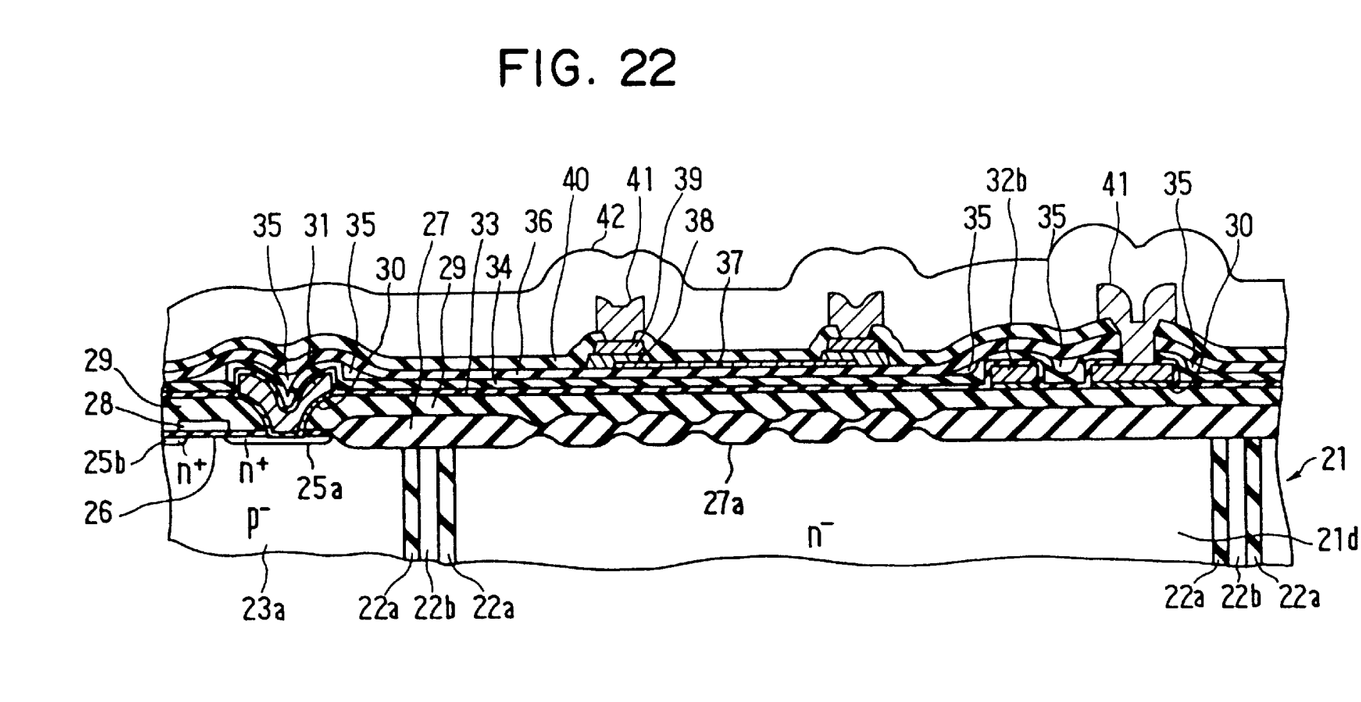

Finally, as shown in FIG. 22, the P-SiN layer 42 that serves as the passivation layer is formed on the entire surface of the substrate at a treatment temperature of, for example, 380° C. According to the above-mentioned processes P1 to P10, the thin film resistor 37 can be formed without being affected by the etching treatments and the like executed in the other processes. At the same time, the first and second Al layers 31 and 41 can be formed with required fine widths. Here, it should be noted that any heat treatment at a temperature higher than 500° C. that deteriorates characteristics of the thin film resistor 37 is not performed after the thin film resistor 37 is formed.

In this embodiment, the thin film resistor 37 is formed on the second TEOS layer 36 and the thin film resistor formation process P5 is performed in a state where the surface of the silicon substrate 21 is not exposed. Therefore, even in the case where the depth of the pn junction is shallow, the surface of the silicon substrate 21 is not damaged through the contact hole 29 by the etching treatments, resulting in a stable characteristics of the pn junction.

Further, in this embodiment, the second Al layer 41 is formed after the third TEOS layer 40 is formed. Therefore, the thin film resistor 37 is not damaged in the second Al layer formation process P9, resulting in a stable characteristics of the thin film resistor 37. Further, the thin film resistor 37 is formed after the contact hole 29a is formed, the thin film resistor 37 need not be exposed to a temperature higher than 500° C. in the subsequent heat treatments, so that the thin film resistor 37 is not deteriorated by the heat treatments. As a result, the thin film resistor 37 can have a required stable value of resistance.

In addition, when the CrSi layer is patterned by the photo-lithography treatment and the dry etching treatment, it is not necessary to form an extra barrier metal layer such as a TiW layer on the CrSi layer. That is, only the CrSi layer is etched to form the thin film resistor 37. As a result, a patterning dimensional accuracy of the thin film resistor 37 can be improved. In addition, because the thin film resistor formation process P5 is performed between the insulating layer (the second TEOS layer) formation process P4 and the insulating layer (the third TEOS layer) formation process P7, the increase of the number of the photo-lithography processes can be restricted as small as possible.

While the present invention has been shown and described with reference to the foregoing preferred embodiment, it will be apparent to those skilled in the art that changes in form and detail may be made therein without departing from the scope of the invention as defined in the appended claims.

For example, the barrier metal may be made of TiN, W, Ti, or the like in place of TiW. The thin film resistor may be made of NiCr br the like in place of CrSi. The thickness of the thin film resistor is preferably in a range of 5 nm to 20 nm. The present invention can be applied to any semiconductor device having a thin film resistor.

Variations such as those described above are to be understood as being within the scope of the present invention as defined by the appended claims.

What is claimed is:

1. A method for manufacturing a semiconductor device including a thin film resistor, the method comprising:

forming a diffusion layer in a surface region of a semiconductor substrate;

forming a first insulating layer on a surface of the semiconductor substrate;

forming a contact hole in the first insulating layer to expose the diffusion layer;

forming a first wiring layer on the first insulating layer, the first wiring layer made of aluminum material and filling the contact hole to electrically communicate with the diffusion layer;

forming a second insulating layer to cover the first wiring layer;

forming the thin film resistor having a specific shape on the second insulating layer;

forming a third insulating layer to cover the thin film resistor and the second insulating layer;

forming a second wiring layer electrically communicating with the thin film resistor through an opening portion provided in the third insulating layer.

2. The method according to claim 1, wherein forming the thin film resistor comprising:

forming a resistive film on the second insulating layer;

patterning the resistive film to form the thin film resistor; and forming a terminal electrode on the thin film resistor for being exposed from the opening portion, the terminal electrode disposed on the thin film resistor with a bottom surface, an entire region of which directly contacts the thin film resistor.

3. The method according to claim 1, wherein the second wiring layer is made of aluminum material.

4. The method according to claim 1, further comprising:

forming a terminal electrode on the thin film resistor before the third insulating layer is formed; and forming the opening portion as a first opening portion in the third insulating layer for exposing the terminal electrode, and a second opening portion in the third insulating layer and the second insulating layer for exposing the first wiring layer, before the second wiring layer is formed, wherein the second wiring layer includes a first part filling the first opening portion and electrically communicating with the thin film resistor through the terminal electrode, and a second part filling the second opening portion and electrically communicating with the first wiring layer.

5. The method according to claim 1, further comprising heating the first insulating layer to round the edge portion of the contact hole, before the first wiring layer is formed.

6. The method according to claim 5, wherein the first insulating layer is made of borophosphosilicate glass.

7. The method according to claim 5, wherein the first insulating layer is heated at a temperature in a range of approximately 900° C. to 950° C.

8. The method according to claim 1, wherein the thin film resistor includes at least one of CrSi and NiCr.

9. The method according to claim 1, further comprising forming a barrier metal layer in the contact hole before the first wiring layer is formed.

10. The method according to claim 9, wherein the barrier metal layer is made of TiN.

11. The method according to claim 1, further comprising forming a terminal electrode on the thin film resistor before the third insulating layer is formed, the terminal electrode being composed of a barrier metal layer directly disposed on the thin film resistor, and an aluminum alloy layer disposed on the barrier metal layer, wherein:
    the second wiring layer electrically communicates with the thin film resistor through the terminal electrode.

12. The method according to claim 11, wherein the barrier metal layer includes at least one selected from a group consisting of TiW, TiN, W, and Ti.

13. The method according to claim 1, wherein the first wiring layer and the second wiring layer are made of aluminum alloy.

* * * * *